US012603021B2

(12) United States Patent
Rossl

(10) Patent No.: US 12,603,021 B2
(45) Date of Patent: Apr. 14, 2026

(54) ELECTRONIC DISPLAY DEVICE FOR FASTENING TO A SHELF EDGE STRIP

(71) Applicant: VusionGroup GmbH, Fernitz-Mellach (AT)

(72) Inventor: Andreas Rossl, Fernitz-Mellach (AT)

(73) Assignee: VusionGroup GmbH, Fernitz-Mellach (AT)

( * ) Notice: Subject to any disclaimer, the term of this patent is extended or adjusted under 35 U.S.C. 154(b) by 328 days.

(21) Appl. No.: 18/251,724

(22) PCT Filed: Nov. 5, 2020

(86) PCT No.: PCT/EP2020/081212
§ 371 (c)(1),
(2) Date: May 4, 2023

(87) PCT Pub. No.: WO2022/096117
PCT Pub. Date: May 12, 2022

(65) Prior Publication Data
US 2023/0410694 A1 Dec. 21, 2023

(51) Int. Cl.
*H05K 5/00* (2025.01)
*G09F 3/20* (2006.01)
*H05K 5/02* (2006.01)

(52) U.S. Cl.
CPC .............. *G09F 3/204* (2013.01); *G09F 3/208* (2013.01); *H05K 5/0086* (2013.01); *H05K 5/0204* (2013.01)

(58) Field of Classification Search
CPC ....... G09F 3/204; G09F 3/208; H05K 5/0086; H05K 5/0204

USPC ......................................................... 361/807
See application file for complete search history.

(56) References Cited

U.S. PATENT DOCUMENTS

| | | | | |
|---|---|---|---|---|
| 10,706,749 | B1 * | 7/2020 | White | ...................... G09F 3/204 |
| 11,967,257 | B2 * | 4/2024 | Pomerantz | ................ G09F 7/18 |
| 2015/0170550 | A1 * | 6/2015 | Jubro | ......................... G09F 7/18 |
| | | | | 40/662 |
| 2016/0073522 | A1 * | 3/2016 | Wunner | ................ G06F 1/1601 |
| | | | | 361/679.01 |

FOREIGN PATENT DOCUMENTS

| | | |
|---|---|---|
| DE | 102017113278 A1 | 12/2018 |
| JP | H08-076886 A | 3/1996 |
| JP | 2006-215193 A | 8/2006 |

(Continued)

OTHER PUBLICATIONS

An Office Action; "Notice of Reasons for Refusal," mailed by the Japanese Patent Office on Oct. 30, 2024, which corresponds to Japanese Patent Application No. 2023-526515 and is related to U.S. Appl. No. 18/251,724; with English language translation.

(Continued)

*Primary Examiner* — Zhengfu J Feng
(74) *Attorney, Agent, or Firm* — Studebaker Brackett PLLC

(57) ABSTRACT

An electronic display device, particularly product information and/or price information display device, which comprises a screen, and a housing or a housing casing, in which the screen is mounted, and a display device reinforcing structure, which is designed for reinforcing the display device with respect to external action of force.

15 Claims, 4 Drawing Sheets

(56) References Cited

FOREIGN PATENT DOCUMENTS

| | | | |
|----|----------------|----|--------|
| JP | 2011082138 | A | 4/2011 |
| KR | 20180029797 | A | 3/2018 |
| WO | 2010/052995 | A1 | 5/2010 |

OTHER PUBLICATIONS

An Office Action; "Notice of Reasons for Refusal," mailed by the Japanese Patent Office on Jun. 5, 2024, which corresponds to Japanese Patent Application No. 2023-526515 and is related to U.S. Appl. No. 18/251,724; with English language translation.

An Office Action mailed by China National Intellectual Property Administration on Oct. 25, 2024, which corresponds to Chinese Patent Application No. 202080106953.X and is related to U.S. Appl. No. 18/251,724.

An Office Action mailed by China National Intellectual Property Administration on Mar. 28, 2025, which corresponds to Chinese Patent Application No. 202080106953.X and is related to U.S. Appl. No. 18/251,724; with English language translation.

Communication pursuant to Article 94(3) EPC issued by the European Patent Office on Jun. 5, 2025, which corresponds to European Patent Application No. 20 804 190.5-1201 and is related to U.S. Appl. No. 18/251,724.

International search report from WO Publication WO 2022/96117 A1 the Parent of the present application.

* cited by examiner

ELECTRONIC DISPLAY DEVICE FOR FASTENING TO A SHELF EDGE STRIP

CROSS-REFERENCE TO RELATED APPLICATIONS

This is a 35 U.S.C. 371 National Stage Patent Application of International Application No. PCT/EP2020/081212, filed Nov. 5, 2020, which is hereby incorporated by reference in its entirety.

An electronic display device of this type (termed ESL in the following) and a shelf edge strip of this type are known for example from PCT/EP2014/053376.

TECHNICAL FIELD

The invention relates to an electronic display device and a shelf edge strip, to which the electronic display device can be fastened.

BACKGROUND

In practice, it has been established that if used improperly, the screen tends to break or have cracks. A tendency to break was established in particular for ESLs which have screen dimensions which exceed the dimension of the fastening structure at the rear of the housing, which is provided for fastening to a shelf edge strip. Such damage to the screen is often caused by carelessness of customers, who in a shop inadvertently guide a shopping trolley into the ESLs fastened to the shelf edge strip or bump into the ESLs with products when removing the products.

Against this background, the object of the invention is to provide an improved electronic display device and an improved shelf edge strip, so that the aforementioned problems are avoided.

SUMMARY OF THE INVENTION

This object is achieved by an electronic display device according to claim 1. The subject matter of the invention is therefore an electronic display device, particularly product information and/or price information display device, which comprises: a screen and a housing or a housing casing, in which the screen is mounted, and a display device reinforcing structure, which is designed for reinforcing the display device with respect to external action of force.

Furthermore, this object is achieved by a shelf edge strip according to claim 14. The subject matter of the invention is therefore a shelf edge strip for mounting at least one electronic display device, particularly product information and/or price information display device, wherein the display device comprises a screen and a housing or a housing casing, in which the screen is mounted, wherein the housing or the housing casing comprises a fastening structure on its housing rear side, which surrounds the screen at the rear side, which fastening structure is designed in such a manner that the display device can be fastened to the shelf edge strip, wherein the shelf edge strip comprises: a first clip element, which extends along the shelf edge strip, and a second clip element, which extends substantially parallel thereto, wherein the two clip elements are designed for clip-like interaction with the fastening structure of the display device, wherein at least one of the two clip elements is designed in such a manner that it forms a shelf edge strip reinforcing structure, which reinforces the housing of a display device, which is properly inserted into the shelf edge strip, at the housing rear side of the display device adjacently to the fastening structure, particularly substantially up to the edge of the housing rear side.

An electronic display device of this type comprises a screen, which is usually realized as an extremely energy-saving electrophoretic screen, also known under the term "electronic paper display", EPD for short. The screen is held in a housing of the display device by means of fastening elements, which ensure that the screen is positioned at its intended position in the housing. Furthermore, electronics are usually accommodated in the housing, which activate the screen, so that e.g. product information or price information for products are displayed on the screen, which are transmitted to the electronics by an external control device, for example an access point in the course of wireless communication. The access point is usually connected to a digital inventory management system or the server thereof and receives the said information from there.

Using the measures according to the invention is associated with the advantage that in addition to the housing or the housing casing and the fastening structure, the display device reinforcing structure is provided, which reinforces the display device with respect to external action of force, so that there is as little deformation of the screen as possible and thus also the tendency of the screen to break caused by the external action of force can substantially be excluded completely. The situation is similar for the shelf edge strip, which extends behind the display device in the viewing direction of the display device fastened to the shelf edge strip and reinforces the same at the rear side of the display device as an external reinforcing structure as it were, with respect to action of force essentially from the front side. As the clip elements are constructed on both sides (with respect to the fastening structure of the display device), the external reinforcing structure may therefore also be present on both sides of the fastening structure. However, display devices are sometimes fastened to the shelf edge strip such that the display devices run upwards virtually level with the shelf or terminate level with the front projecting edge of the shelf or the shelf edge strip. This has predominantly aesthetic reasons. However, for the display device, this means that it often extends longer downwards than upwards with respect to fastening structure. Thus, the external reinforcing structure provided by the shelf edge strip may take account of this situation and be constructed longer on one side of the fastening structure and shorter on the other side of the fastening structure, in order to support or reinforce the rear side of the display device on both sides of the fastening structure over the entire surface to the greatest extent possible. As a result, the action of forces which arise eccentrically to the fastening structure and would lead to a bending moment in the structure of the display device and thus also in the screen, is captured.

Further particularly advantageous embodiments and developments of the invention result from the dependent claims and also the following description.

According to one aspect of the invention, the display device reinforcing structure can comprise a front-side reinforcing element, which grips the screen from its intended viewing side at least in certain areas.

This front-side reinforcing element may for example be designed as a frame and grip the screen in a frame-shaped manner.

The frame may for example be manufactured from a dimensionally stable plastic, such as for example acrylonitrile butadiene styrene copolymer (ABS for short). The frame can also be realized from a composite material, such as for example by means of a carbon reinforced plastic.

The frame can in principle be present without a viewing window or similar, in order to ensure the best readability of the screen content. However, in order to achieve increased reinforcement, it may be advantageous if the frame comprises a viewing window.

In this context, the viewing window may for example consist of a transparent plastic, such as polymethyl methacrylate (PMMA), so that the viewing window comprises the highest impact and scratch resistance. Likewise, the viewing window may consist of a polycarbonate.

The frame and the viewing window may be manufactured from different materials or else from the same material and can also be present as one piece or as separate pieces.

According to a further aspect of the invention, the display device reinforcing structure can comprise a rear-side reinforcing element, which grips the screen directly at its rear side, which faces away from the intended viewing side.

This rear-side reinforcing element may be realized e.g. in a rib-like manner. The rear-side reinforcing element is preferably constructed as a plate and connected to the rear side of the screen in a materially bonded manner, particularly glued or laminated to the rear side. As a result, the cross section of the screen is de facto "increased", therefore it is thicker and the section modulus is increased, as a result of which the screen itself is reinforced.

The plate may be realized as a multilayer structure, preferably as a sandwich structure. This may be understood to mean a wide range of composite materials, the layers of which are connected to one another either in a planar and/or spatially structured manner.

According to a further aspect of the invention, the display device reinforcing structure may comprise a space-filling reinforcing element, which fills an inner space of the housing, lying behind the screen in particular, in a reinforcing manner at least in certain areas. This is associated with the advantage that the inner space areas of the housing which are usually empty in known display devices for reasons of material saving are used in the context of the present invention for the purposes of reinforcement. This measure has therefore proven advantageous in particular, because the trend in modern electronic display devices is towards ever larger screens. As, however, the space requirement for a battery, which may possibly be provided, and the aforementioned electronics does not scale with the size of the screen, the inner space of the housing, which is located behind the screen, also grows. Without a space-filling reinforcing element, the housing of a conventional display device cannot counteract the external action of force to the extent that the tendency of the screen to break can be reliably avoided. This can only be achieved by the space-using provision of the space-filling reinforcing element.

In spite of space-filling dimensions, a variant which is as material-saving as possible may also be advantageous here. Thus, the space-filling reinforcing element may be realized by at least one spatial structure from the group listed below, namely:

a honeycombed spatial structure,
a rib-like spatial structure,
a wave-like spatial structure,
a column-shaped spatial structure,
a spiral spatial structure.

In particular, this is understood to mean structures with elongated base areas. The cross section of the base areas may change with the height of the structure. Thus, the cross section may become narrower in one direction, so that manufacturing by means of injection moulding is possible more easily.

A rib-like spatial structure, is to be understood to mean a structure, in which the material webs for example run in a straight or curved manner. These material webs may run parallel to one another. The spatial structure may consist of a plurality of material webs which are constructed as whole areas or part areas. These material webs may for example also intersect, so that the material-free spaces lying therebetween form prisms. However, the material webs do not have to run straight, rather, different courses are also possible. Thus, the material webs may also be wave-like or spiral. Even these material webs may intersect. However, spatial structures which are not strip-like are also possible. Thus, the space-filling reinforcing element may for example be realized by a plurality of columns. These columns can have a cross section which follows a curve and is preferably round or else an angular cross section. They may exist without contact points with one another or else have points of intersection. However, particularly honeycombed structures have been established as particularly advantageous, in particular if the cavity thereof extends between the inner side of the housing or the housing casing and the screen or the rear side thereof, which is possibly covered with the rear-side reinforcing element. Also, different spatial structures may be combined.

It has been proven particularly advantageous if the space-filling reinforcing element is arranged at least in certain areas behind the screen, particularly adjacently to electronics or an electronic module provided behind the screen, and supports the screen at the rear side thereof towards the housing. There, it reinforces the housing at the point where there would usually be a cavity behind the screen. Thus, forces can be accommodated, which e.g. act flat from the outside on the screen or the layer(s), which outwardly protect the screen, such as e.g. a viewing window, scratch protection, etc., specifically without leading to a breakage-causing distortion of the screen. In this case, one is essentially concerned with support of the screen at its rear side, in order to capture normal forces on the screen. However, the space-filling reinforcing element can also be installed or integrated into the housing or the housing casing such that it reinforces against other forces, which, when acting on the display device, would lead to a breakage-causing curvature or generally deformation of the screen. For this purpose, the space-filling reinforcing element must be integrated into the housing such that it prevents an, in particular critical, distortion of the housing, which is otherwise to be expected when force acts on the housing and which would ultimately also lead to a critical distortion of the screen and thus to screen breakage. The space-filling reinforcing element must therefore interact such with the walls, e.g. arranged behind the screen with the side walls and also with the rear wall of the housing of the display device, that, when force acts from the outside on the display device, it reinforces the inner space of the display device such that the said distortion cannot not occur at all or can only occur minimally to an acceptable degree.

Against this background, it has proven particularly advantageous that the space-filling reinforcing element is designed as a constituent of the housing. This design also makes it possible to realize the space-filling reinforcing element in one work step together with at least one part of the housing. This may take place e.g. in the course of the production of the rear housing side or housing casing in an injection moulding method. In this case, essentially the rear wall, the side walls, the internal fastening elements for electronics and screen are created together with the space-filling reinforcing element in one work step. Therefore, a one-piece design with this housing part results, which entails optimal force transmission of forces acting from the outside on the housing to the space-filling reinforcing element. The space-filling reinforcing element can be realized in such a manner that the housing or the housing casing reinforces optimally, particularly with little material outlay.

In the case of the one-piece design, it may also be advantageous if the remaining space or the space structured by the space-filling reinforcing element is filled with a plastic, such as e.g. epoxy resin, in order to increase the reinforcing effect.

It may also be provided that the space-filling reinforcing element, which is not constructed in one piece with the housing part or the housing casing, is inserted into a curable plastic, such as e.g. epoxy resin or the like, which is introduced into the space of the housing part or the housing casing which is to be filled, and after the curing of the plastic, the said connection of the space-filling reinforcing element to the housing part or the housing casing, which connection improves the reinforcement, is produced. Likewise, after the insertion of the space-filling reinforcing element, the remaining space or the space structured by the space-filling reinforcing element can be cast or filled with the said plastic.

Likewise, the whole space-filling reinforcing element can be formed by the said plastic itself, which then fills the available space at least to the extent that the required reinforcing effect is obtained, or if appropriate fills the available space as completely as possible, in order to obtain a maximum reinforcement.

Also, the housing may comprise a fastening structure at its housing rear side, which surrounds the screen at the rear side, which fastening structure is constructed in such a manner that the display device can be fastened to a shelf edge strip. This fastening structure may for example be constructed flat on the housing rear side. Preferably however, it is lifted towards the shelf edge strip, in order to interact there e.g. in a rail-like or clip-like manner with the same. This means that even the fastening structure as such has a reinforcing effect, as a result of which it may substantially be sufficient that the space-filling reinforcing element is positioned adjacently thereto and therefore reinforces those regions of the housing which are not reinforced by the fastening structure.

The fastening structure does not however have to be present in a closed or encapsulated manner. Thus, at least a part of the fastening structure may be designed as a battery compartment cover. In this case, batteries may be accommodated inside the fastening structure, which batteries are used for the electrical supply of the electronics or the electronic module and the screen. Thus, the fastening structure can be used three times, namely first for fastening the display device to the shelf edge strip, second for reinforcing the housing in its region and third for accommodating the batteries.

With respect to the shelf edge strip, according to a further aspect of the invention, at least one of the two clip elements of the shelf edge strip may comprise an actuating projection, which is dimensioned such that it projects beyond the housing edge of the housing of a display device, which is inserted properly into the shelf edge strip, wherein the clip element which comprises the actuating projection is designed in such a manner that when force acts on the actuating projection, the clip-like interaction with the fastening structure of the display device is releasable. Preferably, this actuating projection is formed along the entire shelf edge strip. The actuating projection can be formed on both clip elements. The actuating projection is particularly preferably formed on the clip element which forms the longer external reinforcing structure. This is associated with the advantage that when there is a corresponding coupling of the relevant clip element to the shelf edge strip, a long lever arm is formed for the actuation, which allows a simple opening of the clip effect.

According to a further aspect, at least one of the clip elements comprises a fixing element, which is intended for interaction with the fastening structure of the display device, for fixing the position of the display device, which fixing element is preferably constructed as a plastic element, particularly preferably realized as a plastic web, which is extruded onto the clip element. This fixing element ensures that when the fastening structure is clipped, no lateral slippage of the display device can occur (under conventional action of manual force or else in the event of inadvertent impact against the display device, e.g. using a shopping trolley or a product). Therefore, the position of the display device along the shelf edge strip is fixed by friction, wherein a free-choice positioning of the display device along the shelf edge strip is of course retained when the clip effect is released (that is to say when the actuating projection is actuated).

These and further aspects of the invention emerge from the figures discussed below.

BRIEF DESCRIPTION OF THE FIGURES

The invention is explained once more in detail in the following with reference to the attached figures on the basis of exemplary embodiments, to which the invention is not restricted, however. In the various figures, identical components are provided with identical reference numbers. In the figures.

DESCRIPTION OF THE EXEMPLARY EMBODIMENTS

Figure 1:
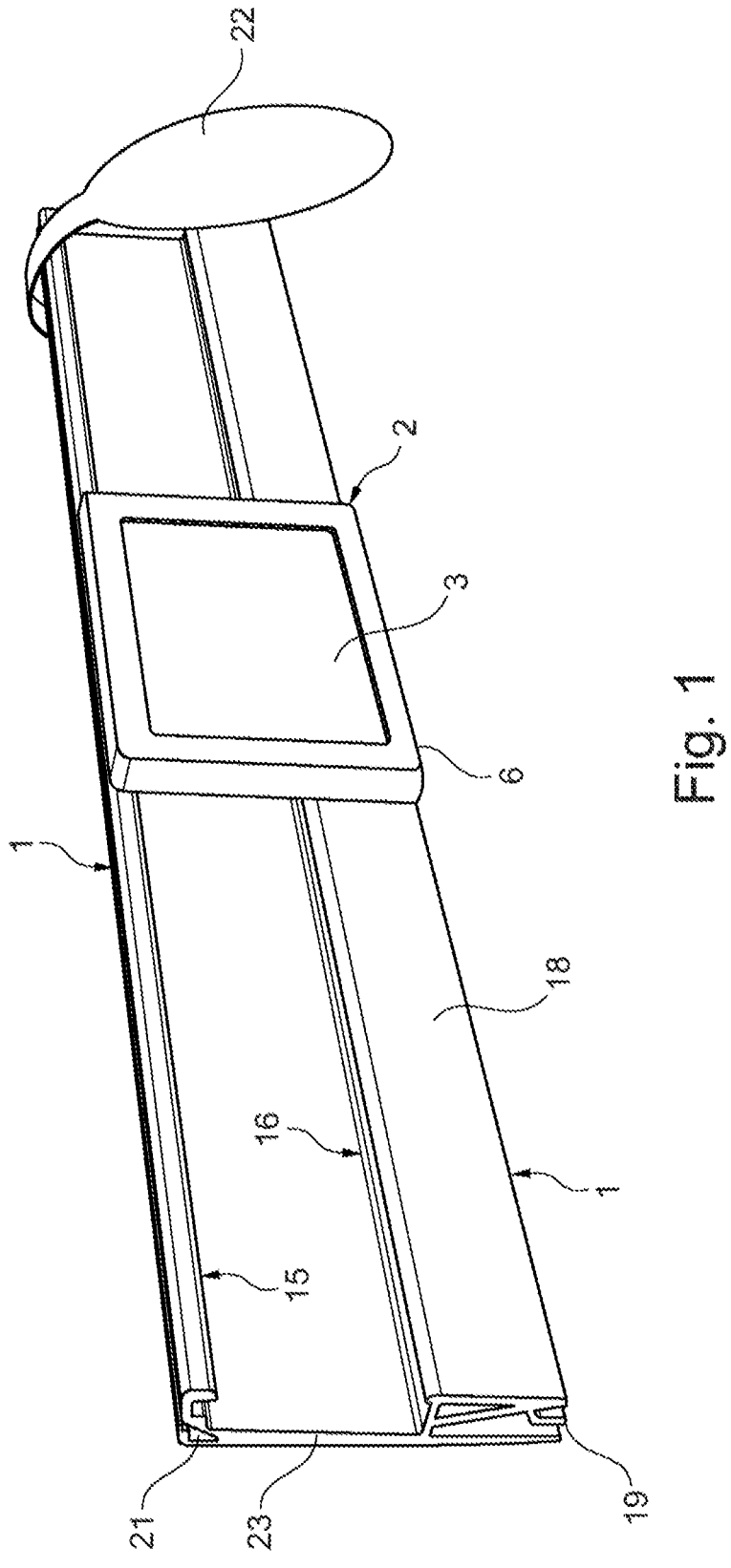
FIG. 1 shows a display device fastened on a shelf edge strip in a schematic manner.

A display device 2 is illustrated in FIG. 1, which is fastened to a shelf edge strip 1, termed an electronic shelf label (ESL) in technical jargon, and, mentioned as ESL 2 in the following.

Figure 2:
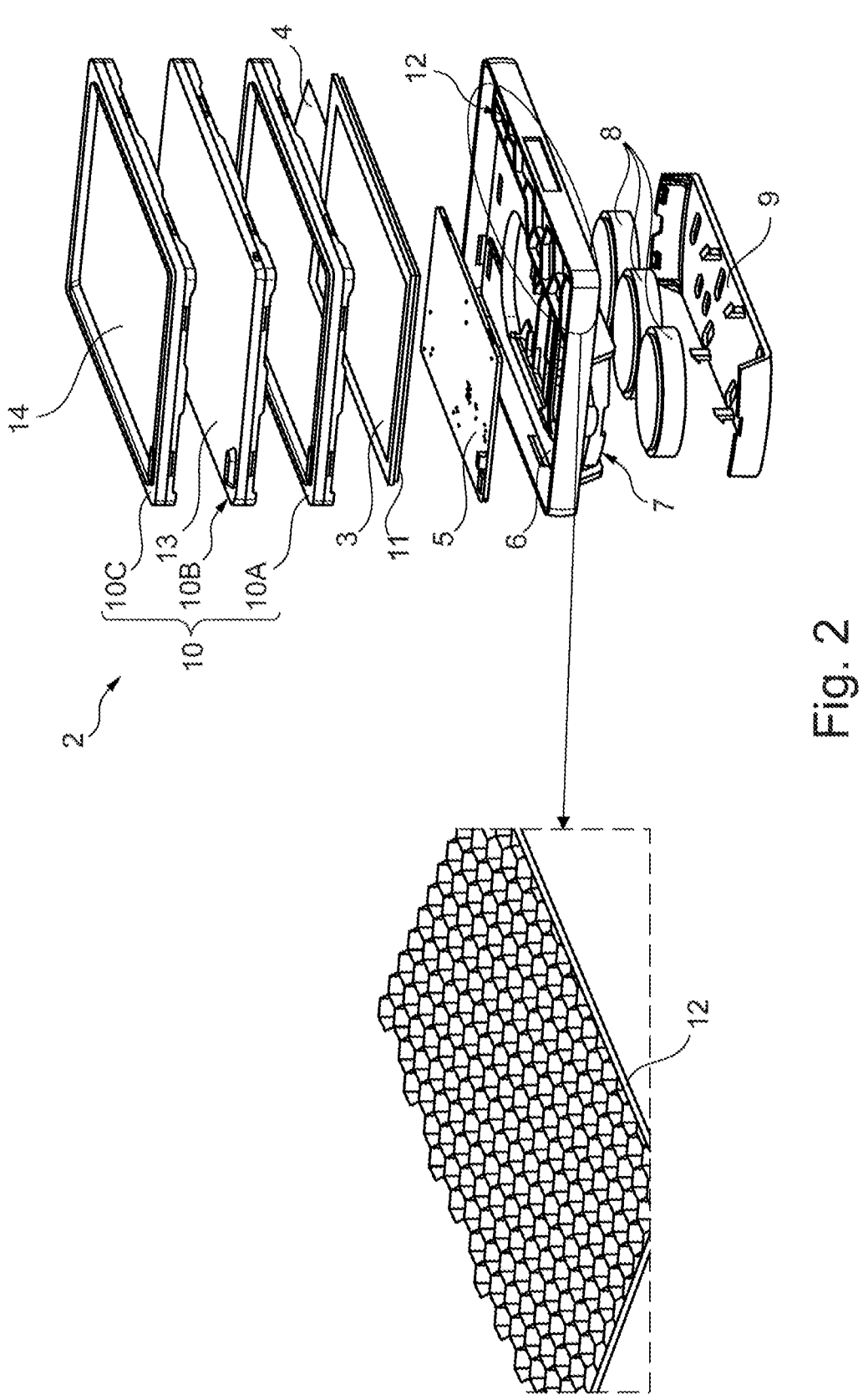
FIG. 2 shows the display device in an exploded illustration in a schematic manner.

Details of the ESL 2 can be seen in the form of an exploded illustration in FIG. 2. The ESL 2 comprises a screen 3. The screen 3 is realized as an electronic paper display (EPD) and therefore comprises its own EPD controller (not illustrated). The screen 3 is connected to electronics 5 of the ESL 2 by means of a ribbon cable 4. These electronics 5 execute the wireless communication with an access point (not illustrated), via which, data which relate to product and/or price information are transmitted to the ESL 2 for visualization using the screen 3. Details for the electronic structure which is used here and for the wireless communication or wireless protocol and the entire system are disclosed for example in PCT/EP2014/053376.

The ESL 2 furthermore comprises a housing casing 6 which surrounds the screen 3 from its rear side, which housing casing is produced from a plastic in an injection moulding method. First, the electronics 5 are inserted into the housing casing 6 onto a mounting zone provided therefor, the electronics 5 are connected via the ribbon cable 4 to the screen 3 and the screen 3 is laid into the housing casing 6 over the electronics 4.

At the rear side of the housing casing 6, a fastening structure 7 is formed for fastening the ESL 2 on the shelf edge strip 1. In its interior, the fastening structure 7 is formed for accommodating three batteries 8 as battery compartment. The electronics 5 contact the inserted batteries 8 by means of contact elements, which are not visible in this perspective, so that the batteries 8 can supply all electronic components of the ESL 2 with energy. The battery compartment formed with the aid of the fastening structure 7 is closed with a battery compartment lid 9.

The ESL 2 comprises a display device reinforcing structure for reinforcement, which is realized as follows.

The display device reinforcing structure first comprises a front-side reinforcing element 10, which can be formed by one of the three embodiments, which are illustrated above one another in FIG. 2 for reasons of clarity. Thus, for example the front-side reinforcing element 10 is formed by a stable frame 10A, which does not comprise a viewing window. Furthermore, the front-side reinforcing element 10 can be realized by a stable (if appropriate also transparent) frame 10B with a viewing window 13. Furthermore, the front-side reinforcing element 10 can be realized by a stable frame 10C with a high-strength viewing window 14.

The display device reinforcing structure furthermore comprises a plate as a rear-side reinforcing element 11, which is present in a sandwich design and which covers the screen 3 over the whole area on its rear side and is directly laminated or bonded onto the rear side of the screen 3.

The display device reinforcing structure furthermore comprises a space-filling reinforcing element 12, which is constructed in one piece with the housing casing 6, that is to say is a constituent of the housing of the ESL 2. The space-filling reinforcing element 12 is structured in a honeycombed manner and fills the inner space of the housing casing 7, which lies adjacently to the electronics 5 or to the fastening structure 7 behind the screen 3. The honeycomb structure can be seen well in the enlargement of the space-filling reinforcing element 12.

Figure 3:
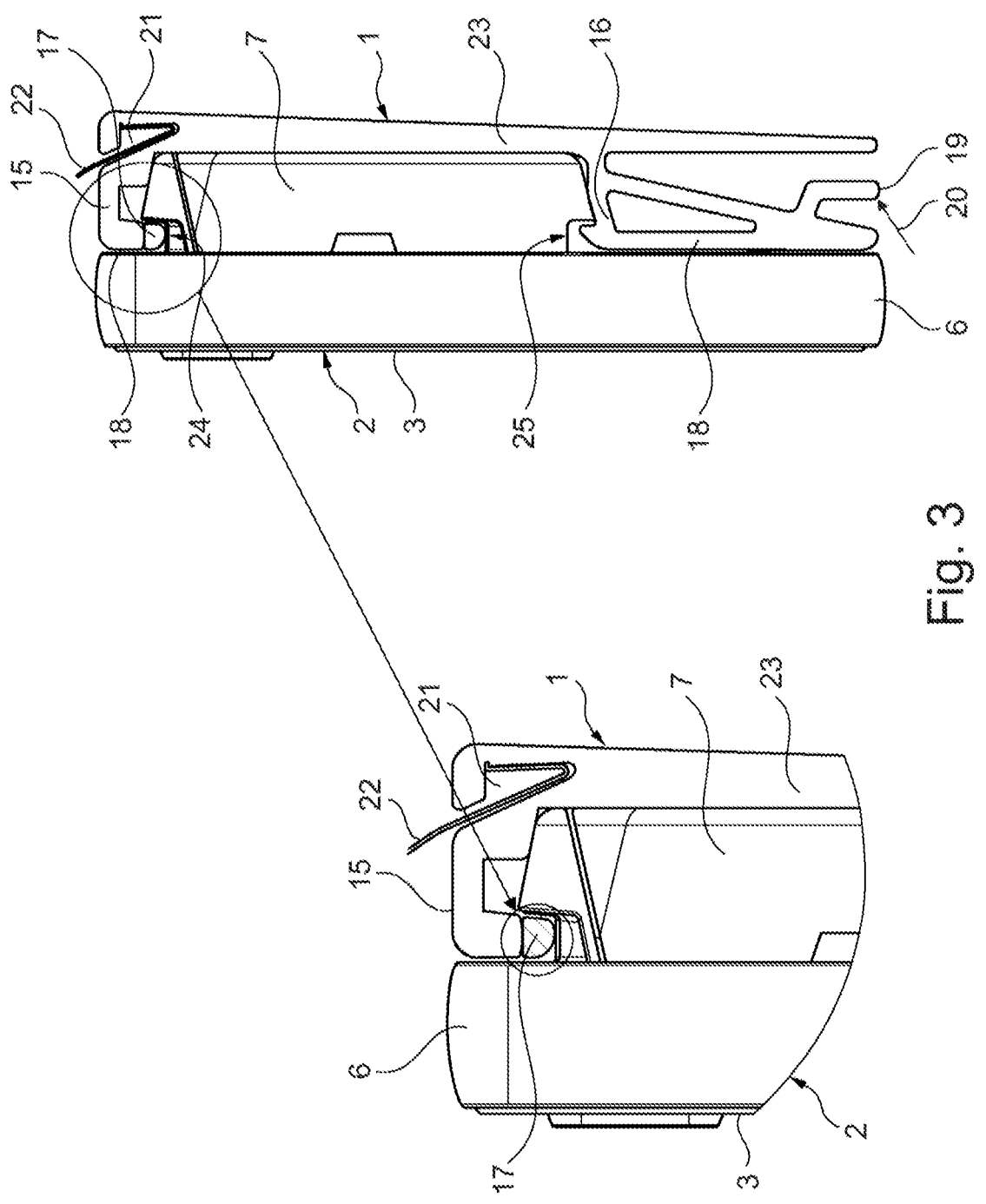
FIG. 3 shows a cross section through the shelf edge strip adjacent to the display device in a schematic manner.

Reference is made to FIG. 3 in the following. A cross section through the shelf edge strip 1 can be seen here with ESL 2 inserted into the shelf edge strip 1. The shelf edge strip 1 comprises a first (upper) clip element 15 and a second (lower) clip element 16, between which the fastening structure 7 of the ESL 2 is clipped. In this case, the first clip element 15 engages into an upper channel 24 and the second clip element 17 engages into a lower channel 25 (see FIG. 1 in this regard). The channels 24 and 25 are formed between the flat surface of the rear wall of the housing casing 7 and an offset region of the fastening structure 7, which is adjacent thereto. It can clearly be seen in the enlargement of the upper region of the clip-like interaction of the fastening structure 7 of the ESL 2 with the first clip element 15, that a plastic web 17 (possibly a rubber covering) is formed at the outermost end of the first clip element 15, which plastic web is pressed against the fastening structure and thus prevents slippage of the ESL 2 in the shelf edge strip. The plastic web forms a fixing element of the shelf edge strip 1.

The first (upper) clip element 15 as well as the second (lower) clip element 16 comprise sections, which run parallel to the rear side of the housing casing 7 and which form the (upper or lower) shelf edge strip reinforcing structures 18 and may be in contact with the housing casing 6 and therefore also contribute to the reinforcement of the ESL 2.

At the head side, the shelf edge strip 1 comprises a channel 21, which is formed for snapping in or inserting a paper- or plastic-based label 22, as can be seen in FIGS. 1 and 3.

The shelf edge strip 1 furthermore comprises an actuating projection 19, which can be actuated manually and, when it is actuated in the direction of the arrow 20, releases the clipping effect between the second clip element 16 and the fastening structure 7. The actuating projection is positioned at a distance from the (lower) shelf edge strip reinforcing structure 18, which is substantially closely adjacent to the housing casing 6, in order to be actuated in a targeted manner.

Figure 4:
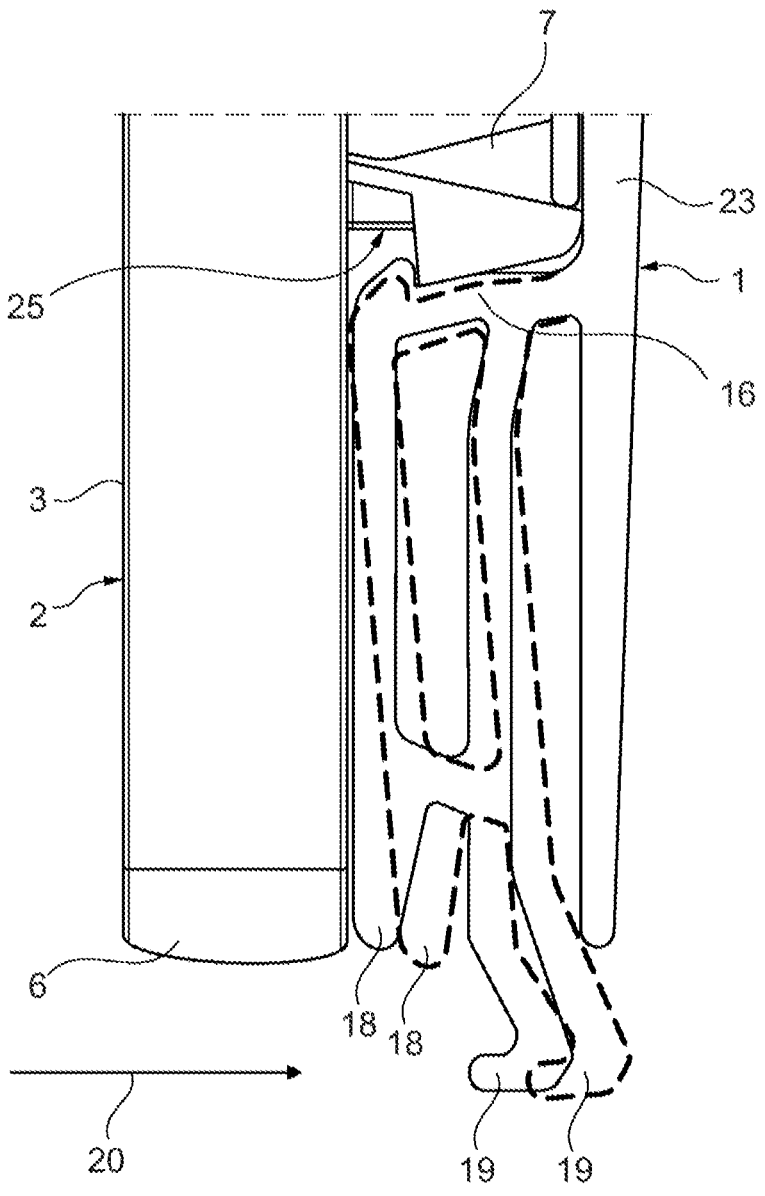
FIG. 4 shows a detail of the lower end of the shelf edge strip in a schematic manner.

To this end, a further embodiment is visualized in FIG. 4, which shows a detail in the region of the second clip element 16, which embodiment enables an even simpler actuation of the actuating projection 19, because the same protrudes beyond the lower edge of the ESL 2. The movement of the second clip element 16 when actuated in the direction of the arrow 20 can also be seen schematically here. In this case, there is an elastic deformation of the catch of the second clip element 16 of the shelf edge strip 1. The (lower) shelf edge strip reinforcing structure 18 is formed or shaped for this such that on the one hand, when the actuating projection 19 is actuated, the second clip element 16 moves away from the first clip element 15 and therefore releases the clamping and on the other hand, as a result of its pivot movement, easily presses the ESL 2 out of the shelf edge strip 1 in the direction of the actuating person. The ESL 2 is thus released during the actuation of the actuating projection 19 and inclined somewhat forwards (towards the actuating hand), which enables a simpler removal of the ESL 2.

Finally, it is also mentioned that when assembling the ESL 2, the housing casing 6 is joined with the respective front-side reinforcing element 10A, 10B or 10C. This may take place by simple interlocking pushing together, by screw fastening, by adhesive bonding or else by welding, as a result of which a closed housing is obtained. For the case that the front-side reinforcing element 10A, that is to say the frame without viewing window, is used, the screen 3 itself also forms a constituent of the housing inside the region formed by the frame.

Finally, it is once more pointed out that the figures previously described in detail are only concerned with exemplary embodiments, which can be modified in many different ways by the person skilled in the art, without departing from the scope of the invention. For the sake of completeness, it is also pointed out that the use of the indefinite article "a" or "an" does not mean that the relevant features cannot also be present multiple times.

The invention claimed is:

1. An electronic display device, the display device being a product information and/or price information display device, the display device comprising:
   a screen, and
   a housing or a housing casing, in which the screen is mounted, and
   a display device reinforcing structure, which is designed for reinforcing the display device with respect to external action of force,
   wherein the display device reinforcing structure comprises a space-filling reinforcing element, which fills an inner space of the housing or the housing casing, which lies behind the screen in a reinforcing manner at least in certain areas.

2. The display device according to claim 1, wherein the display device reinforcing structure comprises a front-side reinforcing element, which grips the screen from its intended viewing side at least in certain areas.

3. The display device according to claim 2, wherein the front-side reinforcing element is designed as a frame and grips the screen in a frame-shaped manner.

4. The display device according to claim 3, wherein the frame comprises a viewing window.

5. The display device according to claim 1, wherein the display device reinforcing structure comprises a rear-side reinforcing element, which grips the screen directly at its rear side, which faces away from the intended viewing side.

6. The display device according to claim 5, wherein the rear-side reinforcing element is constructed as a plate and connected to the rear side of the screen in a materially bonded manner.

7. The display device according to claim 6, wherein the plate is realized as a multilayer structure.

8. The display device according to claim 1, wherein the space-filling reinforcing element is realized by at least one spatial structure from the group listed below, namely:

a honeycombed spatial structure,
   a rib-like spatial structure,
   a wave-like spatial structure, a column-shaped spatial structure,
   a spiral spatial structure.

9. The display device according to claim 1, wherein the space-filling reinforcing element is arranged at least in certain areas behind the screen and supports the screen at the rear side thereof towards the housing or towards the housing casing.

10. The display device according to claim 1, wherein the space-filling reinforcing element is designed as a constituent of the housing or the housing casing.

11. The display device according to claim 1, wherein the housing or the housing casing comprises a fastening structure at its housing rear side, which surrounds the screen at the rear side, which fastening structure is constructed in such a manner that the display device can be fastened to a shelf edge stripes.

12. The display device according to claim 11, wherein at least a part of the fastening structure is designed as a battery compartment cover.

13. The display device according to claim 6, wherein the rear-side reinforcing element is laminated to the rear side of the screen.

14. The display device according to claim 7, wherein the plate is realized as a sandwich structure.

15. The display device according to claim 9, wherein the space-filling reinforcing element is arranged adjacently to electronics provided behind the screen.

\* \* \* \* \*